(12) United States Patent
Takeda et al.

(10) Patent No.: US 8,921,873 B2
(45) Date of Patent: Dec. 30, 2014

(54) LIGHT-EMITTING DEVICE

(71) Applicant: Toyoda Gosei Co., Ltd., Kiyosu-shi (JP)

(72) Inventors: Shigeo Takeda, Kiyosu (JP); Tomohiro Miwa, Kiyosu (JP); Shota Shimonishi, Kiyosu (JP); Hiroyuki Tajima, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/921,103

(22) Filed: Jun. 18, 2013

(65) Prior Publication Data

US 2014/0084311 A1  Mar. 27, 2014

(30) Foreign Application Priority Data

Sep. 25, 2012 (JP) .................. 2012-211038

(51) Int. Cl.
*H01L 33/08* (2010.01)
*H01L 33/48* (2010.01)
*H01L 25/075* (2006.01)
*H01L 33/62* (2010.01)

(52) U.S. Cl.
CPC ... *H01L 25/0753* (2013.01); *H01L 2224/48137* (2013.01); *H01L 33/62* (2013.01)
USPC .... 257/88; 257/99; 257/E33.062; 362/249.02

(58) Field of Classification Search
CPC .................................. H01I 33/08; H01I 33/48
USPC ............ 257/88, 89, 99, E33.062; 362/249.02
See application file for complete search history.

(56) References Cited

U.S. PATENT DOCUMENTS

| | | | |
|---|---|---|---|
| 7,843,131 B2 | 11/2010 | Konishi et al. | |
| 7,897,980 B2 | 3/2011 | Yuan et al. | |
| 8,427,048 B2 | 4/2013 | Konishi et al. | |
| 2008/0111470 A1 | 5/2008 | Yuan et al. | |
| 2008/0224608 A1 | 9/2008 | Konishi et al. | |
| 2010/0097811 A1* | 4/2010 | Betsuda ........................ 362/362 |
| 2011/0044029 A1 | 2/2011 | Konishi et al. | |

FOREIGN PATENT DOCUMENTS

| | | |
|---|---|---|
| JP | 2008-124436 A | 5/2008 |
| JP | 2008-227412 A | 9/2008 |

* cited by examiner

*Primary Examiner* — Colleen A Matthews
*Assistant Examiner* — William Harriston
(74) *Attorney, Agent, or Firm* — McGinn IP Law Group, PLLC

(57) ABSTRACT

The present invention provides a light-emitting device which includes a plurality of LED chips mounted on a chip mount surface of a substrate provided with a wiring pattern. In the light-emitting device, the wiring pattern is provided so as to meet the following conditions (a), (b), and (c). (a) The wiring pattern divides the chip mount surface into at least three divided areas in a radial fashion from a center of the chip mount surface, and includes radial elements and circumferential elements so as to surround divided areas. (b) Of two radial elements and one circumferential element which surround each divided area as viewed from the individual divided area, one or two elements form part of a positive electrode pattern, and the remainder forms part of a negative electrode pattern. (c) There is only one radial element between adjoining ones of the divided areas.

18 Claims, 4 Drawing Sheets though a large number of LED chips are mounted and there are a large number of parallel connections of mounted circuits. Accordingly, the light-emitting device of the present invention has an advantage in that it can uniformly emit light around it.

LIGHT-EMITTING DEVICE

TECHNICAL FIELD

The present invention relates to light-emitting devices in which a plurality of light-emitting diode (LED) chips is mounted on a chip mount surface of a substrate provided with a wiring pattern.

BACKGROUND ART

In light-emitting devices in which a plurality of LED chips is mounted on a chip mount surface of a substrate provided with a wiring pattern, the larger the number of LED chips and the number of parallel connections of mounted circuits are, the more elaborately the wiring pattern need be designed in order that electric connection between the LED chips and the wiring pattern is provided.

A light-emitting device 91 of a conventional example shown in FIG. 4 is a Chip on Board (COB) light-emitting module, and includes a substrate 92, a positive electrode pattern 94 and a negative electrode pattern 95 as a wiring pattern 93, a chip mount surface 96, a plurality of LED chips 97 mounted on the chip mount surface 96, a frame 98 surrounding the chip mount surface 96, a sealant (not shown) filling the inside of the frame 98 to seal the LED chips 97, and a positive electrode 100 and a negative electrode 101 as electrodes located outside the frame 98.

In the illustrated example, 16 LED chips 97 are mounted, every two of which are connected in series, and there are eight parallel connections. In this case, if the wiring pattern 93 is merely provided along the periphery of the chip mount surface 96, it is difficult to provide electric connection because long bonding wires 103 are required etc. Accordingly, the wiring pattern 93 need be extended to the inner part of the chip mount surface 96. As an example, an extended portion 94a of the positive electrode pattern 94 and an extended portion 95a of the negative electrode pattern 95 may be arranged side by side in the central area of the chip mount surface 96, so that the chip mount surface 96 is divided into two areas, namely right and left areas 96a, 96b, by the extended portions 94a, 95a, and the LED chips 97 are mounted in each area 96a, 96b to provide the electric connection.

CITATION LIST

Patent Literature

Patent Literature 1: Japanese Patent Application Publication No. 2008-227412 (JP 2008-227412 A)
Patent Literature 2: Japanese Patent Application Publication No. 2008-124436 (JP 2008-124436 A)

SUMMARY OF INVENTION

Technical Problem

However, in the case where the chip mount surface 96 is divided into the right and left areas 96a, 96b and the LED chips 97 are mounted in each area 96a, 96b, the wiring pattern 93 is not "highly symmetrical when the light-emitting device 91 is viewed from any direction," and it is difficult for the light-emitting device 91 to uniformly emit light around it.

Since the extended portion 94a of the positive electrode pattern 94 and the extended portion 95a of the negative electrode pattern 95 are arranged side by side, the areas 96a, 96b are widely separated from each other, and the LED chips 97 mounted in the area 96a are also widely separated from those mounted in the area 96b. Accordingly, the LED chips 97 are also not arranged in a highly symmetrical manner, which increases non-uniform light emission.

Solution to Problem

A light-emitting device according to the present invention includes: a plurality of LED chips mounted on a chip mount surface of a substrate provided with a wiring pattern. In the light-emitting device, the wiring pattern is provided so as to meet the following conditions (a), (b), and (c):

(a) the wiring pattern divides the chip mount surface into at least three divided areas in a radial fashion from a center of the chip mount surface, and includes radial elements and circumferential elements so as to surround divided areas;

(b) of two radial elements and one circumferential element which surround each divided area as viewed from the individual divided area, one or two elements form part of a positive electrode pattern, and the remainder forms part of a negative electrode pattern; and (c) there is only one radial element between adjoining ones of the divided areas (two or more radial elements are not provided side by side).

Advantageous Effects of Invention

The light-emitting device of the present invention not only can provide electric connection between the LED chips and the wiring pattern but also has high symmetry of both the wiring pattern and the arrangement of the LED chips, even though a large number of LED chips are mounted and there are a large number of parallel connections of mounted circuits. Accordingly, the light-emitting device of the present invention has an advantage in that it can uniformly emit light around it.

DESCRIPTION OF EMBODIMENTS

A light-emitting device according to the present invention includes: a plurality of LED chips mounted on a chip mount surface of a substrate provided with a wiring pattern. In the light-emitting device, the wiring pattern is provided so as to meet the following conditions (a), (b), and (c):

(a) the wiring pattern divides the chip mount surface into at least three divided areas in a radial fashion from a center of the chip mount surface, and includes radial elements and circumferential elements so as to surround divided areas;

(b) of two radial elements and one circumferential element which surround each divided area as viewed from the individual divided area, one or two elements form part of a positive electrode pattern, and the remainder forms part of a negative electrode pattern; and (c) there is only one radial element between adjoining ones of the divided areas (two or more radial elements are not provided side by side).

First Embodiment

Figure 1A:
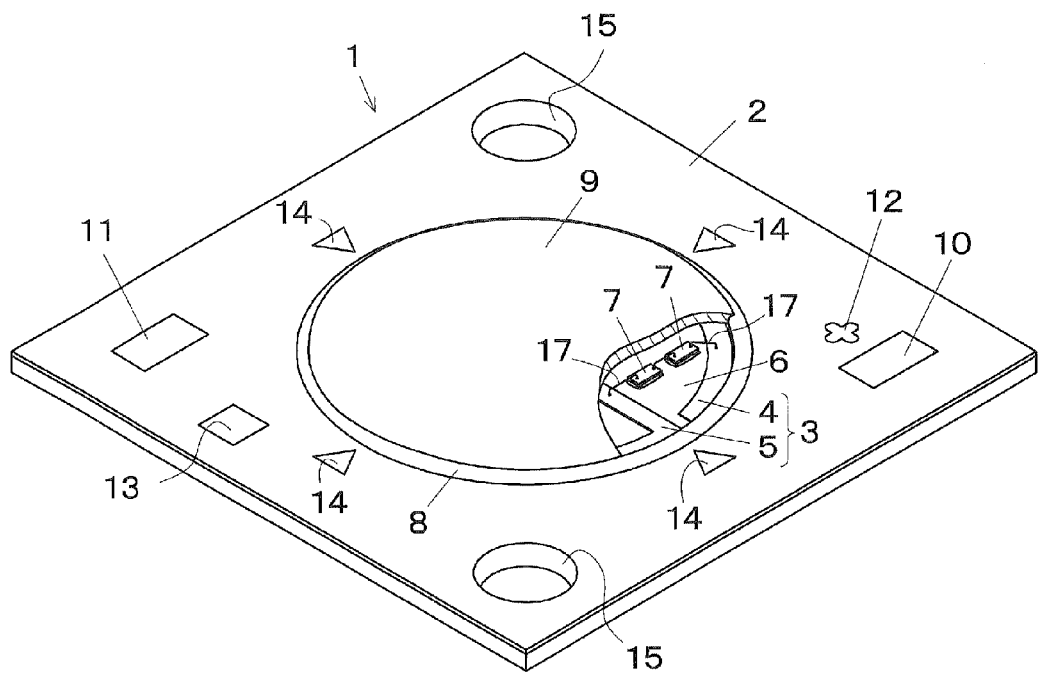
FIG. 1A is a perspective view showing a light-emitting device of a first embodiment with a sealing resin partially removed.
Figure 1B:
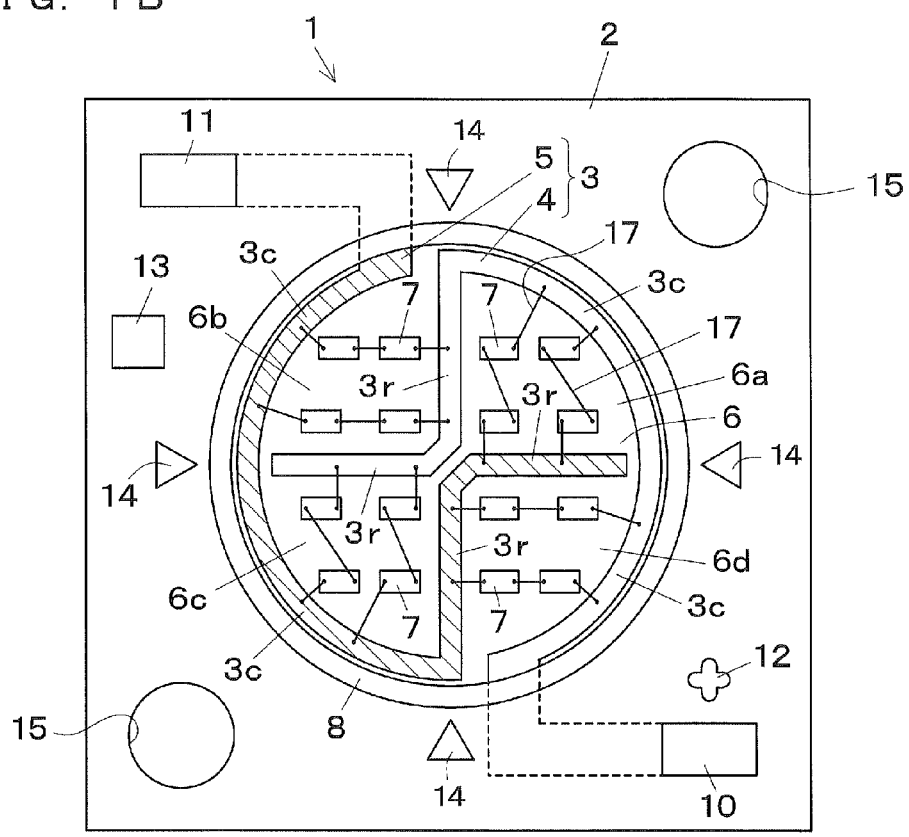
FIG. 1B is a plan view showing the light-emitting device with the sealing resin entirely removed.

A light-emitting device 1 of a first embodiment shown in FIGS. 1A and 1B is a Chip on Board (COB) light-emitting module, and includes a substrate 2, a positive electrode pattern 4 and a negative electrode pattern 5 as a wiring pattern 3, a chip mount surface 6, a plurality of LED chips 7 mounted on the chip mount surface 6, a frame 8 surrounding the chip mount surface 6, a sealant 9 filling the inside of the frame 8 to seal the LED chips 7, and a positive electrode 10 and a negative electrode 11 as electrodes located outside the frame 8. The negative electrode pattern 5 is shown shaded in the figure so that it can be easily distinguished from the positive electrode pattern 4 (the same applies to the following description).

The light-emitting device 1 further includes outside the frame 8 a polarity indicator 12 of the electrode, a case temperature (Tc) measuring portion 13, an alignment mark 14, etc. as necessary.

The substrate 2 is made of ceramic in this example. However, the material of the substrate 2 is not particularly limited as long as it is thermally conductive, and the substrate 2 may be made of a resin, a metal, etc. The substrate 2 is quadrilateral in this example. However, the shape of the substrate 2 is not particularly limited, and the substrate 2 may be circular, triangular, etc. Attachment holes 15 are formed in the corners of the substrate 2 in this example. However, cutouts may be formed in the substrate 2, or the holes or cutouts may not be formed. The lower surface of the substrate 2 is thermally coupled to a heat radiator (not shown). The aforementioned wiring pattern etc. (3 to 12) are provided on the upper surface of the substrate 2.

The positive electrode pattern 4 and the negative electrode pattern 5 as the wiring pattern 3 are provided so as to meet the following conditions (a), (b), and (c):

(a) the wiring pattern 3 divides the chip mount surface 6 into at least three (in this example, four) divided areas 6a, 6b, 6c, and 6d in a radial fashion from its center, and includes radial elements 3r and circumferential elements 3c so as to surround divided areas 6a, 6b, 6c, 6d;

(b) of two radial elements 3r and one circumferential element 3c which surround each divided area 6a, 6b, 6c, 6d as viewed from the individual divided area 6a, 6b, 6c, 6d, one or two elements form part of the positive electrode pattern 4, and the remainder forms part of the negative electrode pattern 5; and (c) there is only one radial element 3r between adjoining ones of the divided areas (e.g., 6a and 6b) (two or more radial elements are not provided side by side).

More specifically, in the present embodiment, the positive electrode pattern 4 connected to the positive electrode 10 extends to the inside of the frame 8, extends substantially halfway along the periphery of the chip mount surface 6 in the counterclockwise direction to form a substantially semicircular arc shape, is bent at the distal end of the semicircular arc shape toward the center of the chip mount surface 6 along a radius, and is bent at 90 degrees at the distal end of the radius in the opposite direction from the semicircular arc shape along a radius. The negative electrode pattern 5 connected to the negative electrode 11 extends to the inside of the frame 8 from the 180-degree opposite side from the positive electrode pattern 4, extends substantially halfway along the periphery of the chip mount surface 6 in the counterclockwise direction to form a substantially semicircular arc shape, is bent at the distal end of the semicircular arc shape toward the center of the chip mount surface 6 along a radius, and is bent at 90 degrees at the distal end of the radius in the opposite direction from the semicircular arc shape along a radius.

Of two radial elements 3r and one circumferential element 3c which surround the first divided area 6a, one radial element 3r and the circumferential element 3c form part of the positive electrode pattern 4, and the other radial element 3r forms part of the negative electrode pattern 5.

Of two radial elements 3r and one circumferential element 3c which surround the second divided area 6b, the two radial elements 3r form part of the positive electrode pattern 4, and the circumferential element 3c forms part of the negative electrode pattern 5.

Of two radial elements 3r and one circumferential element 3c which surround the third divided area 6c, one radial element 3r forms part of the positive electrode pattern 4, and the other radial element 3r and the circumferential element 3c form part of the negative electrode pattern 5.

Of two radial elements 3r and one circumferential element 3c which surround the fourth divided area 6d, the circumferential element 3c forms part of the positive electrode pattern 4, and the two radial elements 3r form part of the negative electrode pattern 5.

It should be understood that a necessary insulation distance is provided between the positive electrode pattern 4 and the negative electrode pattern 5. As used herein, the term "surround" thus allows for this insulation distance or a separation that is caused between the patterns for any other reasons.

The shape of the chip mount surface 6 is not particularly limited, and the chip mount surface 6 may be circular, quadrilateral (square, rectangular, rhombus-shaped, etc.; including quadrilaterals with rounded corners), barrel-shaped, triangular, etc. The chip mount surface 6 is circular in the illustrated example.

The LED chips 7 are preferably of a surface mount type. Although the type of the LED chips 7 is not particularly limited, the LED chips 7 are of a face-up mount type in the illustrated example. Accordingly, in order that electric connection is provided between the LED chips 7 and the wiring pattern 3 and between the LED chips 7, the LED chips 7 and the wiring pattern 3 are wire-bonded to P-type and N-type electrode pads formed on the upper surfaces of the LED chips 7 by bonding wires 17. Although an emitted light color of the LED chips 7 is not particularly limited, for example, the LED chips 7 that emit blue light are used.

The number of LED chips 7 to be mounted is not particularly limited. In this example, four LED chips 7 are mounted in each divided area 6a, 6b, 6c, 6d, and thus the total number of LED chips 7 is 16. In the illustrated example, every two of the four LED chips 7 in each divided area 6a, 6b, 6c, 6d are connected in series, and the two pairs of series-connected LED chips 7 are connected in parallel, although the present invention is not limited to this. In this case, two bonding locations are required for each of the positive electrode pattern 4 and the negative electrode pattern 5. According to the present invention, since every divided area 6a, 6b, 6c, 6d is surrounded by part of the positive electrode pattern 4 and part of the negative electrode pattern 5, the bonding locations can be easily secured in the part of the positive electrode pattern 4 and the part of the negative electrode pattern 5.

The chip mount surface 6 is divided into the four divided areas 6a, 6b, 6c, and 6d in a radial fashion (preferably equiangularly) from its center, and the LED chips 7 are mounted in each divided area 6a, 6b, 6c, 6d. Accordingly, the wiring pattern 3 is highly symmetrical when the light-emitting device 1 is viewed from any direction, and the light-emitting device 1 can uniformly emit light around it.

There is only one radial element 3r between adjoining ones of the divided areas (e.g., 6a and 6b) (two or more radial elements are not provided side by side). This allows adjoining ones of the divided areas to be located close to each other, and thus allows the LED chips 7 mounted in the adjoining divided areas not to be widely separated from each other. This improves symmetry of the LED chips 7, and also reduces non-uniform light emission.

The material of the sealant 9 is not particularly limited. For example, the sealant 9 may be a resin, glass, etc. The sealant 9 may contain a fluorescent material as necessary according to a desired output light color etc. For example, in the case of using the LED chips 7 emitting blue light, blue light is output as it is unless the sealant 9 contains a fluorescent material. If the sealant 9 contains a fluorescent material that is excited by blue light to emit yellow light, white light is output as a mixture of the blue light and the yellow light that are complimentary to each other.

Second Embodiment

Figure 2A:
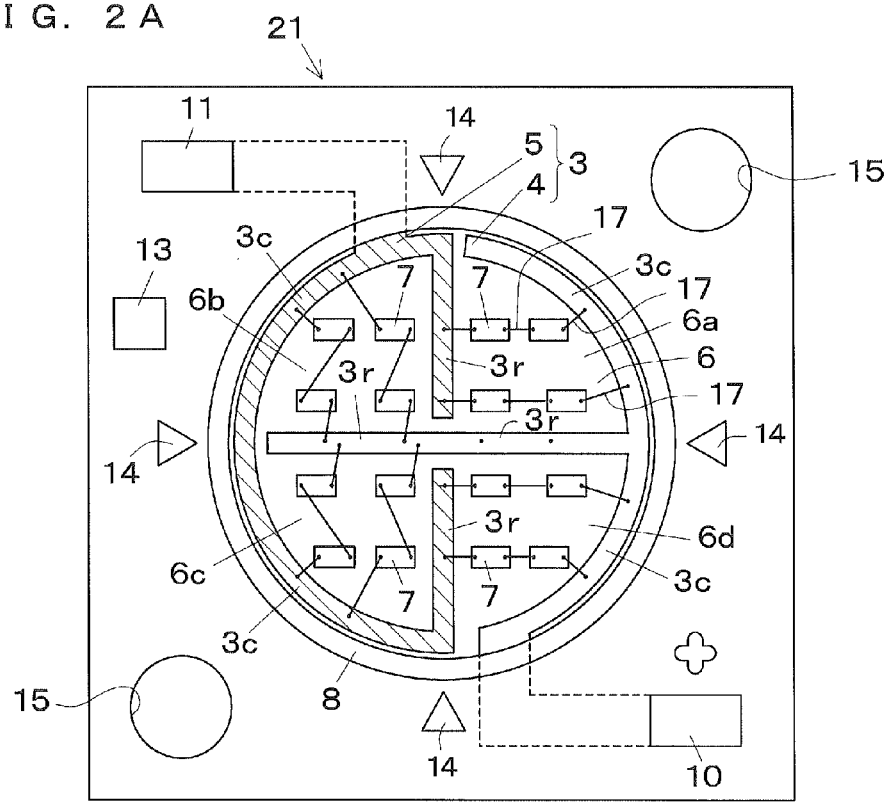
FIG. 2A is a plan view showing a light-emitting device of a second embodiment with a sealing resin entirely removed.

A light-emitting device 21 of a second embodiment shown in FIG. 2A is different from the first embodiment only in the way the positive electrode pattern 4 and the negative electrode pattern 5 as the wiring pattern 3 are provided. The light-emitting device 21 of the second embodiment is otherwise the same as the first embodiment. In particular, the present embodiment is the same as the first embodiment in that the positive electrode pattern 4 and the negative electrode pattern 5 as the wiring pattern 3 are provided so as to meet the conditions (a), (b), and (c) described above. Only the differences between the first and second embodiments will be described.

Specifically, in the present embodiment, the positive electrode pattern 4 connected to the positive electrode 10 extends to the inside of the frame 8, extends substantially halfway along the periphery of the chip mount surface 6 in the counterclockwise direction to form a substantially semicircular arc shape, and branches off in the middle of the semicircular arc shape and extends along a diameter so as to pass through the center of the chip mount surface 6. The negative electrode pattern 5 connected to the negative electrode 11 extends to the inside of the frame 8 from the 180-degree opposite side from the positive electrode pattern 4, extends substantially halfway along the periphery of the chip mount surface 6 in the counterclockwise direction to form a substantially semicircular arc shape, is bent at the base end of the semicircular arc shape toward the center of the chip mount surface 6 along a radius, and is bent at the distal end of the semicircular arc shape toward the center of the chip mount surface 6 along a radius.

Of two radial elements 3r and one circumferential element 3c which surround the first divided area 6a, one radial element 3r and the circumferential element 3c form part of the positive electrode pattern 4, and the other radial element 3r forms part of the negative electrode pattern 5.

Of two radial elements 3r and one circumferential element 3c which surround the second divided area 6b, one radial element 3r forms part of the positive electrode pattern 4, and the other radial element 3r and the circumferential element 3c form part of the negative electrode pattern 5.

Of two radial elements 3r and one circumferential element 3c which surround the third divided area 6c, one radial element 3r forms part of the positive electrode pattern 4, and the other radial element 3r and the circumferential element 3c form part of the negative electrode pattern 5.

Of two radial elements 3r and one circumferential element 3c which surround the fourth divided area 6d, one radial element 3r and the circumferential element 3c form part of the positive electrode pattern 4, and the other radial element 3r forms part of the negative electrode pattern 5.

Accordingly, the present embodiment can also have an advantage similar to that of the first embodiment.

Third Embodiment

Figure 2B:
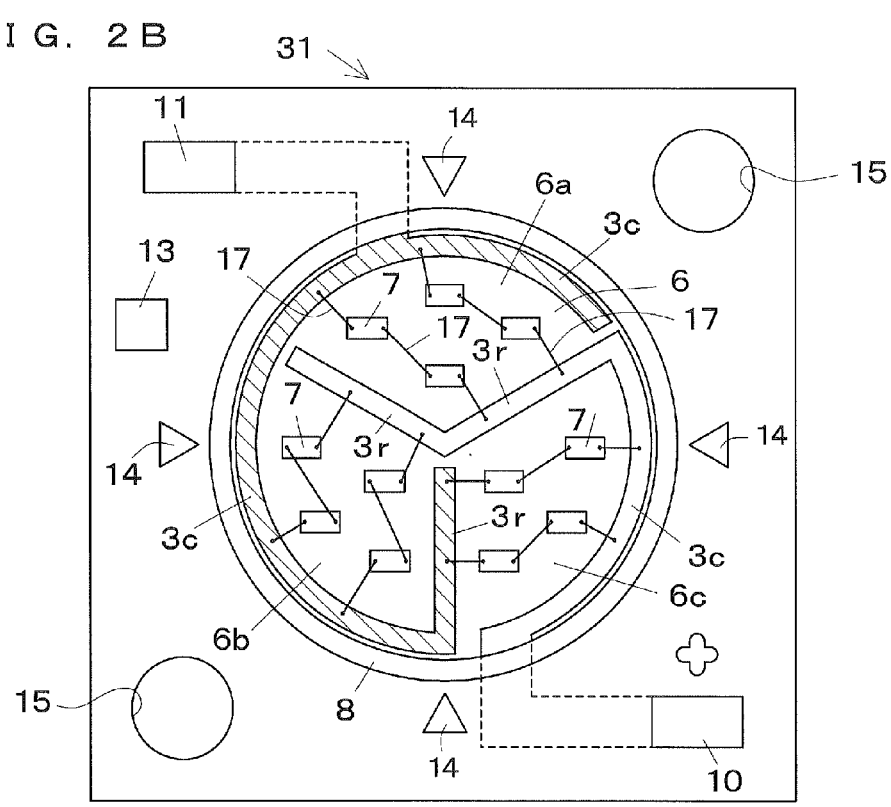
FIG. 2B is a plan view showing a light-emitting device of a third embodiment with a sealing resin entirely removed.

A light-emitting device 31 of a third embodiment shown in FIG. 2B is different from the first embodiment only in that the chip mount surface 6 is divided into three divided areas 6a, 6b, and 6c in a radial fashion from its center, and in the way the positive electrode pattern 4 and the negative electrode pattern 5 as the wiring pattern 3 are provided. The light-emitting device 31 of the third embodiment is otherwise the same as the first embodiment. In particular, the present embodiment is the same as the first embodiment in that the positive electrode pattern 4 and the negative electrode pattern 5 as the wiring pattern 3 are provided so as to meet the conditions (a), (b), and (c) described above. Only the differences between the first and third embodiments will be described.

Specifically, in the present embodiment, the positive electrode pattern 4 connected to the positive electrode 10 extends to the inside of the frame 8, extends along about one third of the periphery of the chip mount surface 6 in the counterclockwise direction to form a circular arc shape, is bent at the distal end of the circular arc shape toward the center of the chip mount surface 6 along a radius, and is bent at 60 degrees at the distal end of the radius in the opposite direction from the circular arc shape along a radius. The negative electrode pattern 5 connected to the negative electrode 11 extends to the inside of the frame 8 from the 180-degree opposite side from the positive electrode pattern 4, extends substantially halfway along the periphery of the chip mount surface 6 in the counterclockwise direction to form a substantially semicircular arc shape, and is bent at the distal end of the semicircular arc shape toward the center of the chip mount surface 6 along a radius. In addition, the negative electrode pattern 5 extended to the inside of the frame 8 extends along about one sixth of the periphery of the chip mount surface 6 in the clockwise direction to form a circular arc shape.

Of two radial elements 3r and one circumferential element 3c which surround the first divided area 6a, the two radial elements 3r form part of the positive electrode pattern 4, and the circumferential element 3c forms part of the negative electrode pattern 5.

Of two radial elements 3r and one circumferential element 3c which surround the second divided area 6b, one radial element 3r forms part of the positive electrode pattern 4, and the other radial element 3r and the circumferential element 3c form part of the negative electrode pattern 5.

Of two radial elements 3r and one circumferential element 3c which surround the third divided area 6c, one radial element 3r and the circumferential element 3c form part of the positive electrode pattern 4, and the other radial element 3r forms part of the negative electrode pattern 5.

Accordingly, the present embodiment can also have an advantage similar to that of the first embodiment.

Fourth Embodiment

Figure 3:
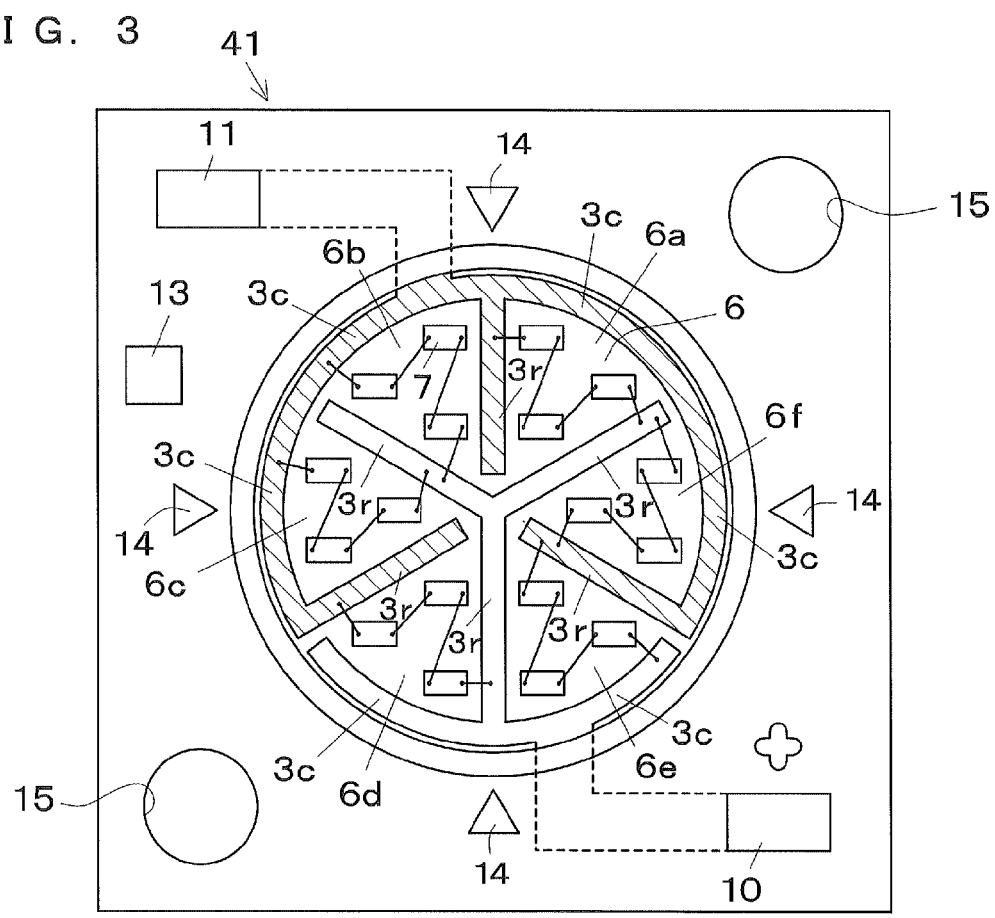
FIG. 3 is a plan view showing a light-emitting device of a fourth embodiment with a sealing resin entirely removed.
Figure 4:
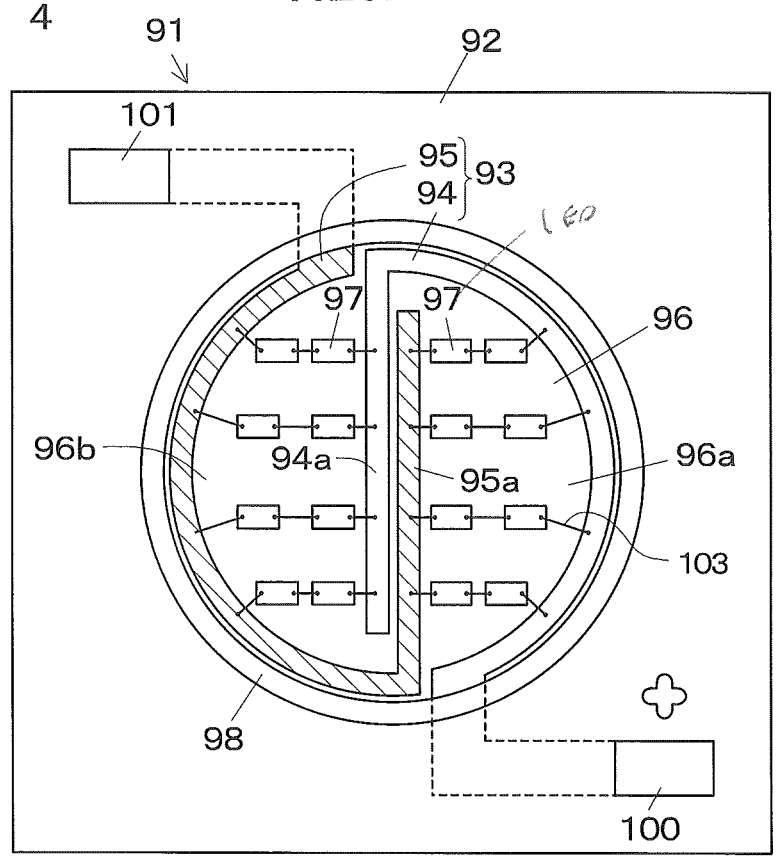
FIG. 4 is a plan view showing a light-emitting device of a conventional example with a sealing resin entirely removed.

A light-emitting device 41 of a fourth embodiment shown in FIG. 3 is different from the first embodiment only in that the chip mount surface 6 is divided into six divided areas 6a, 6b, 6c, 6d, 6e, and 6f in a radial fashion from its center, in the way the positive electrode pattern 4 and the negative electrode pattern 5 as the wiring pattern 3 are provided, and in the number of LED chips 7 to be mounted and their connection. The light-emitting device 41 of the fourth embodiment is otherwise the same as the first embodiment. In particular, the present embodiment is the same as the first embodiment in that the positive electrode pattern 4 and the negative electrode pattern 5 as the wiring pattern 3 are provided so as to meet the conditions (a), (b), and (c) described above. Only the differences between the first and fourth embodiments will be described below.

Specifically, in the present embodiment, the positive electrode pattern 4 connected to the positive electrode 10 extends to the inside of the frame 8, extends along about one sixth of the periphery of the chip mount surface 6 in the counterclockwise direction to form a circular arc shape, also extends along about one sixth of the periphery of the chip mount surface 6 in the clockwise direction to form a circular arc shape. In addition, the positive electrode pattern 4 extended to the inside of the frame 8 extends toward the center of the chip mount surface 6 along a radius, and branches off from the distal end of the radius at 60 degrees to both right and left along radius. The negative electrode pattern 5 connected to the negative electrode 11 extends to the inside of the frame 8 from the 180-degree opposite side from the positive electrode pattern 4, extends about one third of the periphery of the chip mount surface 6 in the counterclockwise direction to form a circular arc shape, and is bent at the distal end of the circular arc shape toward the center of the chip mount surface 6 along a radius. In addition, the negative electrode pattern 5 extended to the inside of the frame 8 extends along about one third of the periphery of the chip mount surface 6 in the clockwise direction to form a circular arc shape, and is bent at the distal end of the circular arc shape toward the center of the chip mount surface 6 along a radius. In addition, the negative electrode pattern 5 extended to the inside of the frame 8 extends toward the center of the chip mount surface 6 along a radius.

Of two radial elements 3r and one circumferential element 3c which surround the first divided area 6a, one radial element 3r forms part of the positive electrode pattern 4, and the other radial element 3r and the circumferential element 3c form part of the negative electrode pattern 5.

Of two radial elements 3r and one circumferential element 3c which surround the second divided area 6b, one radial element 3r forms part of the positive electrode pattern 4, and the other radial element 3r and the circumferential element 3c form part of the negative electrode pattern 5.

Of two radial elements 3r and one circumferential element 3c which surround the third divided area 6c, one radial element 3r forms part of the positive electrode pattern 4, and the other radial element 3r and the circumferential element 3c form part of the negative electrode pattern 5.

Of two radial elements 3r and one circumferential element 3c which surround the fourth divided area 6d, one radial element 3r and the circumferential element 3c form part of the positive electrode pattern 4, and the other radial element 3r forms part of the negative electrode pattern 5.

Of two radial elements 3r and one circumferential element 3c which surround the fifth divided area 6e, one radial element 3r and the circumferential element 3c form part of the positive electrode pattern 4, and the other radial element 3r forms part of the negative electrode pattern 5.

Of two radial elements 3r and one circumferential element 3c which surround the sixth divided area 6f, one radial element 3r forms part of the positive electrode pattern 4, and the other radial element 3r and the circumferential element 3c form part of the negative electrode pattern 5.

Accordingly, the present embodiment can also have an advantage similar to that of the first embodiment.

The present invention is not limited to the above embodiments, and can be modified and embodied as appropriate without departing from the spirit and scope of the invention.

REFERENCE SIGNS LIST 1 light-emitting device
2 substrate
3 wiring pattern
3c circumferential element
3r radial element
4 positive electrode pattern
5 negative electrode pattern
6 chip mount surface
6a, 6b, 6c, 6d, 6e, 6f divided area
7 LED chip
8 frame
9 sealant
10 positive electrode
11 negative electrode
17 bonding wire
21 light-emitting device
31 light-emitting device
41 light-emitting device

The invention claimed is:

1. A light-emitting device, comprising:
a plurality of LED chips mounted on a chip mount surface of a substrate provided with a wiring pattern, wherein the wiring pattern is provided so as to meet the following conditions (a), (b), and (c):
(a) the wiring pattern divides the chip mount surface into at least three divided areas in a radial fashion from a center of the chip mount surface, and includes radial elements and circumferential elements so as to surround divided areas;
(b) of two radial elements and one circumferential element which surround each divided area as viewed from the individual divided area, one or two elements form part of a positive electrode pattern, and the remainder forms part of a negative electrode pattern; and
(c) there is only one radial element between adjoining ones of the divided areas.

2. The light-emitting device according to claim 1, wherein the positive electrode pattern is connected to a positive electrode,
wherein the positive electrode pattern extends to an inside of a frame surrounding the chip mount surface,
wherein the positive electrode pattern extends substantially halfway along a periphery of the chip mount surface in a counterclockwise direction to form a semicircular arc shape,
wherein the positive electrode pattern is bent at a distal end of the semicircular arc shape toward the center of the chip mount surface along a radius, and
wherein the positive electrode pattern is bent at 90 degrees at a distal end of the radius in an opposite direction from the semicircular arc shape along the radius.

3. The light-emitting device according to claim 2, wherein the negative electrode pattern is connected to a negative electrode,
wherein the negative electrode pattern extends to the inside of the frame from a 180-degree opposite side from the positive electrode pattern, wherein the negative electrode pattern extends substantially halfway along the periphery of the chip mount surface in a counterclockwise direction to form a semicircular arc shape, wherein the negative electrode pattern is bent at a distal end of the semicircular arc shape toward the center of the chip mount surface along a radius, and wherein the negative electrode pattern is bent at 90 degrees at a distal end of the radius in an opposite direction from the semicircular arc shape along a radius.

4. The light-emitting device according to claim 1, wherein the positive electrode pattern is connected to a positive electrode, wherein the positive electrode pattern extends to an inside of a frame surrounding the chip mount surface, wherein the positive electrode pattern extends substantially halfway along a periphery of the chip mount surface in a counterclockwise direction to form a semicircular arc shape, and wherein the positive electrode pattern branches off in a middle of the semicircular arc shape and extends along a diameter so as to pass through the center of the chip mount surface.

5. The light-emitting device according to claim 4, wherein the negative electrode pattern is connected to a negative electrode, wherein the negative electrode pattern extends to the inside of the frame from a 180-degree opposite side from the positive electrode pattern, wherein the negative electrode pattern extends substantially halfway along the periphery of the chip mount surface in the counterclockwise direction to form a semicircular arc shape, wherein the negative electrode pattern is bent at a base end of the semicircular arc shape toward the center of the chip mount surface along a radius, and wherein the negative electrode pattern is bent at a distal end of the semicircular arc shape toward the center of the chip mount surface along a radius.

6. The light-emitting device according to claim 1, wherein the positive electrode pattern is connected to a positive electrode, wherein the positive electrode pattern extends to an inside of a frame surrounding the chip mount surface, wherein the positive electrode pattern extends along one-third of a periphery of the chip mount surface in a counterclockwise direction to form a circular arc shape, wherein the positive electrode pattern is bent at a distal end of the circular arc shape toward the center of the chip mount surface along a radius, and wherein the positive electrode pattern is bent at 60 degrees at a distal end of the radius in an opposite direction from the circular arc shape along a radius.

7. The light-emitting device according to claim 6, wherein the negative electrode pattern is connected to a negative electrode, wherein the negative electrode pattern extends to the inside of the frame from a 180-degree opposite side from the positive electrode pattern, wherein the negative electrode pattern extends substantially halfway along the periphery of the chip mount surface in the counterclockwise direction to form a semicircular arc shape, and wherein the negative electrode pattern is bent at a distal end of the semicircular arc shape toward the center of the chip mount surface along a radius.

8. The light-emitting device according to claim 7, wherein the negative electrode pattern extended to the inside of the frame extends along one-sixth of the periphery of the chip mount surface in a clockwise direction to form a circular arc shape.

9. The light-emitting device according to claim 1, wherein the positive electrode pattern is connected to a positive electrode, wherein the positive electrode pattern extends to an inside of the frame surrounding the chip mount surface, wherein the positive electrode pattern extends along one-sixth of a periphery of the chip mount surface in a counterclockwise direction to form a circular arc shape, and wherein the positive electrode pattern extends along one-sixth of the periphery of the chip mount surface in a clockwise direction to form a circular arc shape.

10. The light-emitting device according to claim 9, wherein the positive electrode pattern extended to the inside of the frame extends toward the center of the chip mount surface along a radius, and wherein the positive electrode pattern branches off from a distal end of the radius at 60 degrees to both right and left along a radius.

11. The light-emitting device according to claim 9, wherein the negative electrode pattern is connected to a negative electrode, wherein the negative electrode pattern extends to the inside of the frame from a 180-degree opposite side from the positive electrode pattern, wherein the negative electrode pattern extends one-third of the periphery of the chip mount surface in the counterclockwise direction to form a circular arc shape, and wherein the negative electrode pattern is bent at a distal end of the circular arc shape toward the center of the chip mount surface along a radius.

12. The light-emitting device according to claim 11, wherein the negative electrode pattern extended to the inside of the frame extends along one-third of the periphery of the chip mount surface in a clockwise direction to form a circular arc shape, and wherein the negative electrode pattern is bent at a distal end of the circular arc shape toward the center of the chip mount surface along a radius.

13. The light-emitting device according to claim 12, wherein the negative electrode pattern extended to the inside of the frame extends toward the center of the chip mount surface along a radius.

14. The light-emitting device according to claim 1, wherein the plurality of LED chips comprises pairs of LED chips connected in series in each divided area, and wherein the pairs of series-connected LED chips are connected in parallel.

15. The light-emitting device according to claim 1, wherein the plurality of LED chips are bonded to at least a part of both the positive electrode pattern and the negative electrode pattern.

16. The light-emitting device according to claim 1, wherein each divided area is substantially equal in size.

17. The light-emitting device according to claim 1, wherein the wiring pattern is symmetrical.

18. The light-emitting device according to claim 1, wherein the substrate comprises a thermally conductive material.

* * * * *